United States Patent
Epler

(10) Patent No.: US 8,314,443 B2
(45) Date of Patent: Nov. 20, 2012

(54) SEMICONDUCTOR LIGHT EMITTING DEVICE WITH A CONTACT FORMED ON A TEXTURED SURFACE

(75) Inventor: John E Epler, San Jose, CA (US)

(73) Assignees: Koninklijke Philips Electronics N.V., Eindhoven (NL); Philips Lumileds Lighting Company LLC, San Jose, CA (US)

( * ) Notice: Subject to any disclaimer, the term of this patent is extended or adjusted under 35 U.S.C. 154(b) by 0 days.

(21) Appl. No.: 13/461,874

(22) Filed: May 2, 2012

(65) Prior Publication Data

US 2012/0217533 A1 Aug. 30, 2012

Related U.S. Application Data

(63) Continuation of application No. 13/311,606, filed on Dec. 6, 2011, now Pat. No. 8,188,508, which is a continuation of application No. 12/487,314, filed on Jun. 18, 2009, now Pat. No. 8,089,091.

(51) Int. Cl.
  *H01L 29/22* (2006.01)
  *H01L 29/227* (2006.01)
  *H01L 21/768* (2006.01)
  *H01L 21/00* (2006.01)

(52) U.S. Cl. ............ 257/99; 257/96; 257/E21.575; 438/26; 438/42

(58) Field of Classification Search ............ 257/96, 257/99, E21.575; 438/26, 42
See application file for complete search history.

(56) References Cited

U.S. PATENT DOCUMENTS

| | | | |
|---|---|---|---|
| 6,455,878 B1 | 9/2002 | Bhat et al. | |
| 6,828,596 B2 | 12/2004 | Steigerwald et al. | |
| 7,679,097 B2 | 3/2010 | Akaishi | |
| 7,736,945 B2 | 6/2010 | Schiaffino et al. | |
| 7,754,507 B2 | 7/2010 | Epler et al. | |
| 7,875,984 B2 | 1/2011 | Epler | |
| 8,067,780 B2 | 11/2011 | Shieh | |
| 2004/0188696 A1* | 9/2004 | Hsing Chen et al. | 257/99 |
| 2006/0278884 A1 | 12/2006 | Chen | |
| 2007/0023777 A1* | 2/2007 | Sonobe et al. | 257/103 |
| 2007/0096130 A1 | 5/2007 | Schiaffino et al. | |
| 2007/0181889 A1* | 8/2007 | Orita | 257/79 |
| 2008/0054290 A1 | 3/2008 | Shieh et al. | |
| 2010/0227421 A1 | 9/2010 | Neff | |

* cited by examiner

*Primary Examiner* — Luan C Thai

(57) ABSTRACT

A device includes a semiconductor structure comprising a light emitting layer disposed between an n-type region and a p-type region. The semiconductor structure includes an n-contact region and a p-contact region. A cross section of the n-contact region comprises a plurality of first regions wherein portions of the light emitting layer and p-type region are removed to expose the n-type region. The plurality of first regions are separated by a plurality of second regions wherein the light emitting layer and p-type region remain in the device. The device further includes a first metal contact formed over the semiconductor structure in the p-contact region and a second metal contact formed over the semiconductor structure in the n-contact region. The second metal contact is in electrical contact with at least one of the second regions in the n-contact region.

14 Claims, 2 Drawing Sheets ness during bonding, to overcome slight variations in the topography of the LED die electrodes and the submount electrodes. Aggressive bonding conditions can cause damage to the semiconductor material in the LED during bonding. Aggressive bonding conditions may be necessitated by the lack of compliance (i.e. deformation and collapse) in the electrodes during bonding, due to the large area of the electrodes.

SEMICONDUCTOR LIGHT EMITTING DEVICE WITH A CONTACT FORMED ON A TEXTURED SURFACE

This is a continuation of prior application entitled "SEMICONDUCTOR LIGHT EMITTING DEVICE WITH A CONTACT FORMED ON A TEXTURED SURFACE", Ser. No. 13/311,606 filed on Dec. 6, 2011, which is itself a continuation of Ser. No. 12/487,314, now U.S. Pat. No. 8,089,091 entitled "SEMICONDUCTOR LIGHT EMITTING DEVICE WITH A CONTACT FORMED ON A TEXTURED SURFACE", filed Jun. 18, 2009 both of which are incorporated by reference herein.

FIELD OF INVENTION

The invention relates to a flip chip semiconductor light emitting device with an n-contact disposed on a surface of the semiconductor structure with a plurality of openings to the n-type region etched through the p-type region and the light emitting layer.

BACKGROUND

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, composite, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

US Patent Application 2007-0096130 describes "a process for forming an LED structure using a laser lift-off process to remove the growth substrate (e.g., sapphire) after the LED die is bonded to a submount." To eliminate the need to use an underfill between the submount and the LED die to support the die, the underside of the LED die has formed on it anode and cathode electrodes that are substantially in the same plane, where the electrodes cover at least 85% of the back surface of the LED structure. The submount has a corresponding layout of anode and cathode electrodes substantially in the same plane.

"The LED die electrodes and submount electrodes are interconnected together such that virtually the entire surface of the LED die is supported by the electrodes and submount. No underfill is used. Different methods for LED to submount interconnection can be used, such as ultrasonic or thermosonic metal-to-metal interdiffusion (Gold-Gold, Copper-Copper, other ductile metals, or a combination of the above), or soldering with different alloy compositions such as Gold-Tin, Gold-Germanium, Tin-Silver, Tin-Lead, or other similar alloy systems.

"The growth substrate, forming the top of the LED structure, is then removed from the LED layers using a laser lift-off process, which ablates the material at the interface of the growth substrate and the LED layers. The extremely high pressures created during the laser lift-off process do not damage the LED layers due to the large area support of the LED layers by the electrodes and submount. Other substrate removal processes can also be used.

SUMMARY

It is an object of the invention to form the n-contact on a surface of the semiconductor structure with a plurality of openings etched through the p-type region and the light-emitting layer to expose the n-type region. In some embodiments, the openings may be small enough and spaced close enough together that the semiconductor structure is adequately supported during substrate removal, without requiring a thick contact to compensate for the difference in height between the top of the n-type region exposed by etching and the top of the p-type region.

In some embodiments, a device includes a semiconductor structure comprising a light emitting layer disposed between an n-type region and a p-type region. The semiconductor structure includes an n-contact region and a p-contact region. A cross section of the n-contact region comprises a plurality of first regions wherein portions of the light emitting layer and p-type region are removed to expose the n-type region. The plurality of first regions are separated by a plurality of second regions wherein the light emitting layer and p-type region remain in the device. The device further includes a first metal contact formed over the semiconductor structure in the p-contact region and a second metal contact formed over the semiconductor structure in the n-contact region. The second metal contact is in electrical contact with at least one of the second regions in the n-contact region.

DETAILED DESCRIPTION

In devices with large-area metal contacts, as described above in US Patent Application 2007-0096130, large bonding pressure and ultrasonic power may be necessary during bonding, to overcome slight variations in the topography of the LED die electrodes and the submount electrodes. Aggressive bonding conditions can cause damage to the semiconductor material in the LED during bonding. Aggressive bonding conditions may be necessitated by the lack of compliance (i.e. deformation and collapse) in the electrodes during bonding, due to the large area of the electrodes.

One solution is proposed in U.S. application Ser. No. 12/397,392, "Compliant Bonding Structures for Semiconductor Devices," which is incorporated herein by reference. A compliant bonding structure is disposed between an LED die and a mount. The compliant bonding structure may be disposed on the LED die, on the mount, or on both the LED die and the mount. During bonding, the compliant structure collapses and reflows, resulting in a robust electrical, thermal, and mechanical connection that may not require aggressive bonding conditions and that may compensate for slight variations in the topography of the LED die and the mount.

Figure 1:
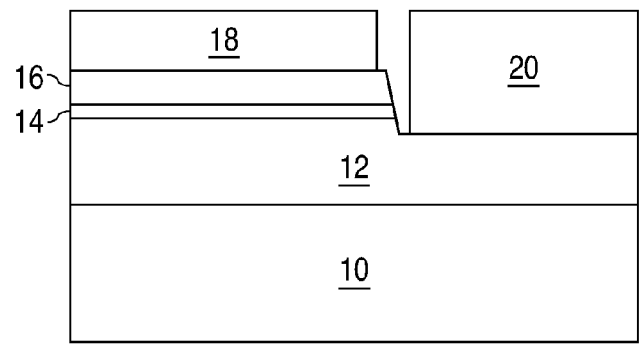
FIG. 1 is a cross sectional view of a flip chip semiconductor light emitting device with a thick n-contact.

III-nitride flip chip devices, such as the structures of 2007-0096130 and U.S. Ser. No. 12/397,392, where both the p- and n-contacts are formed on the same side of the semiconductor structure, require an etch to expose a portion of the buried n-type region. Such a device is illustrated in FIG. 1. A semiconductor structure including an n-type region 12, a light emitting region 14, and a p-type region 16 is grown over a growth substrate 10. A portion of the light emitting region 14 and p-type region 16 are etched away to reveal a portion of the n-type region. In order to form a planar surface for bonding the device to a mount, a structure must be included to compensate for the difference in height between the surface of the p-type region on which the p-contact 18 is formed and the surface of the n-type region on which the n-contact 20 is formed. The height-compensating structure is typically a dielectric/metal layer stack that may redistribute both contacts to the topmost surface, or a thick metal n-contact 20, as illustrated in FIG. 1. An intermetallic dielectric layer complicates fabrication of the device and may result in electrical shorting due to dielectric failure, and thick metal n-contacts fabricated to be coplanar to the p-contact surface can be difficult and/or expensive to produce.

In embodiments of the invention, in the region where the n-metal contact is formed, part of the semiconductor structure is exposed for etching and a group of small regions are protected. In the protected regions, the light emitting layer, p-type region, and p-contact metal remain, forming micron-scale semiconductor islands or bumps surrounded by the region of exposed n-type material. The bumps may be, for example, 3 microns in diameter with an 8 micron center-to-center spacing, thereby occupying 14% of the n-contact region. Photoresist is applied to the wafer and lithography used to open up the region of the n-contact region and semiconductor bumps and also open up at least part of the p-contact. A metal such as AlNiTiAu stack is evaporated over the resist and the metallization patterned by lift-off. The n-contact is formed where the metal covers the etched regions and a co-planar p-contact is formed where the metal covers the p-contact region. During bonding to a mount, the conformal contact may act as a compliant bonding structure, as described above. In some embodiments, the photoresist openings in the region of the p-contact form a plurality of bumps of similar pattern as the semiconductor bumps in the region of the n-contact. The bumps in the p-contact and n-contact regions may be precisely coplanar with no adjustments required in the process and the entire bonding structure may be compliant FIGS. 2 and 3 illustrate forming a structure according to embodiments of the invention.

Figure 2:
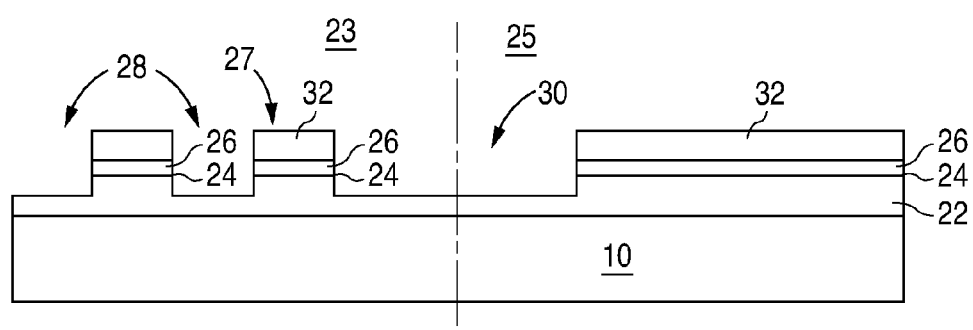
FIG. 2 illustrates a portion of a III-nitride semiconductor structure after etching to expose parts of the n-type region.
Figure 3:
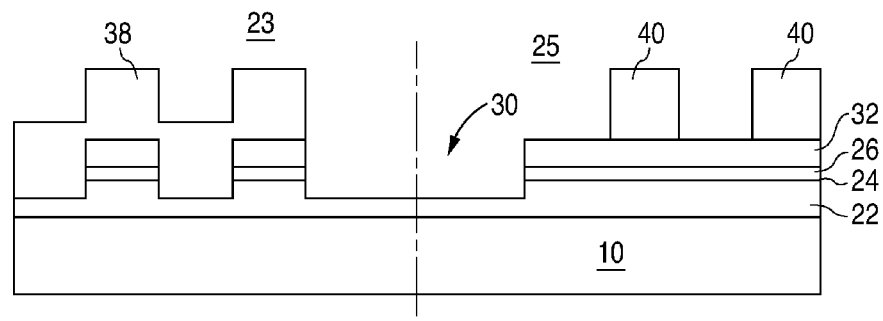
FIG. 3 illustrates the structure of FIG. 2 after forming and patterning a thick metal layer.

In FIG. 2, a semiconductor structure including an n-type region, a light emitting or active region, and a p-type region is grown over a growth substrate 10, which may be any suitable growth substrate and which is typically sapphire or SiC. An n-type region 22 is grown first over substrate 10. N-type region 22 may include multiple layers of different compositions and dopant concentration including, for example, preparation layers such as buffer layers or nucleation layers, which may be n-type or not intentionally doped, release layers designed to facilitate later release of the growth substrate or thinning of the semiconductor structure after substrate removal, and n- or even p-type device layers designed for particular optical or electrical properties desirable for the light emitting region to efficiently emit light.

A light emitting or active region 24 is grown over n-type region 22. Examples of suitable light emitting regions include a single thick or thin light emitting layer, or a multiple quantum well light emitting region including multiple thin or thick quantum well light emitting layers separated by barrier layers. For example, a multiple quantum well light emitting region may include multiple light emitting layers, each with a thickness of 25 ∈ or less, separated by barriers, each with a thickness of 100 ∈ or less. In some embodiments, the thickness of each of the light emitting layers in the device is thicker than 50 ∈.

A p-type region 26 is grown over light emitting region 24. Like the n-type region, the p-type region may include multiple layers of different composition, thickness, and dopant concentration, including layers that are not intentionally doped, or n-type layers.

One or more metals 32, which serve as the p-contact, are formed over the p-type region 26. P-contact 32 may include, for example, a reflective metal such as silver in direct contact with or in close proximity to the p-type region, and a guard material, often a metal, formed over the reflective metal.

The structure is then masked and etched to form the structure shown in FIG. 2. In a single etching step, portions of the p-type region 26 and the light emitting region 24 are removed to expose a wide region 30 and several narrower regions 28 of n-type region 22. FIG. 2 illustrates a p-contact region 25 and an n-contact region 23, separated by the dashed line through wide region 30. It is to be understood that only a portion of the p- and n-contact regions for a complete device are illustrated in FIG. 2. Wide region 30 electrically isolates the p- and n-contacts.

The width of wide region 30 may be, for example, between 20 and 30 microns in some embodiments. Compliant metal bonding structures may be formed over the n- and p-type regions, as described below in reference to FIG. 4. When the device is bonded to a mount, as described below in reference to FIG. 5, the compliant metal bonding structures collapse and spread. A width narrower than 20 microns for wide region 30, in some embodiments, may be insufficient to electrically isolate the n- and p-contacts, as the compliant bonding structures spread after deforming during bonding, and high volume die bonding tools typically have a greater than 15 micron tolerance in placement accuracy. The width of region 30 accommodates the spreading of the bumps and the placement accuracy of the die bonding tools. After bonding the device to a mount, in some embodiments the growth substrate is removed. A width wider than 30 microns for wide region 30, in some embodiments, may insufficiently support the semiconductor structure during growth substrate removal, resulting in cracking or other damage to the semiconductor structure. An underfill may be added if gaps 30 greater than 30 microns are desired.

In some embodiments, narrow regions 28 are holes formed in the semiconductor structure that are round, square, or any other suitable shape. The remaining portions 27 of the p-type region and light emitting layer form a contiguous region in which the holes are formed. Narrow regions 28 may be, for example, between 1 and 5 microns in diameter. The centers of nearest-neighbor narrow regions may be, for example, between 4 and 8 microns apart. In one example, narrow regions 28 are round holes 3 microns in diameter formed on 6 micron centers. The depth of the holes is sufficient to reach a layer in the n-type region suitable for forming a contact, about 2 microns in one example.

In some embodiments, narrow regions 28 are not holes but a contiguous region. Posts 27 of the remaining portions of the p-type region and light emitting layer are disposed in the contiguous region. Posts 27 may be round, square, or any other suitable shape. Posts 27 may be, for example, between 1 and 5 microns in diameter. The centers of nearest-neighbor posts 27 may be, for example, between 4 and 8 microns apart. In one example, posts 27 are round, are 3 microns in diameter, and are formed on 6 micron centers.

In the structure illustrated in FIG. 3, a thick metal is formed over the device illustrated in FIG. 2, for example by electroplating or sputtering. The metal coats the top surfaces and etched valleys equally and coats the sidewalls of the structure to a lesser extent but sufficient to electrically connect all of the top surfaces and valleys. Portions of the thick metal layer, such as in wide region 30 and between contact bumps 40, are removed, for example by lift-off. The thick metal layer remaining in the n-contact region 23 forms n-contact 38, which includes several contact bumps as the thick metal layer was formed over the uneven, textured surface shown in FIG. 2. The n-contact 38 is electrically connected to both the n-type region 22, in the openings 28, and the p-type region 26 and p-contact metal 29 remaining in the small semiconductor regions 27 left between openings 28. No light is generated in the active region remaining in the small semiconductor regions left between openings 28, since the n-contact 38 electrically connects to both the n-type region 22 and the p-type region 26, causing a short. Since current spreads readily in n-type III-nitride material, the current injected by n-contact 38 into the n-type region 22 at the bottom of openings 28 is sufficient to forward bias the device.

In some embodiments, before forming the thick metal layer, the device is coated with an insulating layer such as a silicon nitride layer. The insulating layer is removed from the n- and p-contact regions, but remains on the bottom and sidewalls of wide region 30, and on the sidewalls of the p-contact region.

The thick metal that forms n-contact 38 and p-contact bumps 40 may be a compliant metal, for example with a Young's modulus less than 150 GPa. Examples of suitable metals include gold, with a Young's modulus of about 78 GPa, copper, with a Young's modulus between about 110 and 128 GPa, and aluminum, with a Young's modulus of about 70 GPa.

In some embodiments, the contact bumps 40 formed on the p-contact 32 are similar in size and spacing to the narrow regions 28 on the n-contact areas of the device, formed as described above in reference to FIG. 2, though they need not be. Contact bumps 40 may be, for example, round, square, or any other suitable shape. Contact bumps may be, for example, between 1 and 5 microns in diameter. The centers of nearest-neighbor contact bumps 40 may be, for example, between 4 and 8 microns apart. In one example, contact bumps 40 are round bumps 3 microns in diameter formed on 6 micron centers. The contact bumps may be, for example, between 1 and 5 microns tall.

Figure 4:
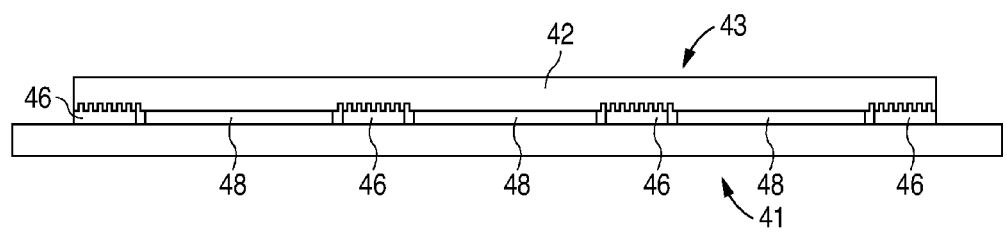
FIG. 4 illustrates a III-nitride light emitting device bonded to a mount.

The structure illustrated in FIG. 3 may then be flipped and mounted on a mount, as illustrated in FIG. 4. Contact bumps may be formed on the mount to align with the bumps in n-contact 38 and contact bumps 40 on the p-contact 32, which are shown in FIG. 3. Contact bumps may be formed on only one of the LED die and the mount, or on both. The LED die 43 may be connected to the mount 41 by applying pressure between the LED die and the mount. Pressure may be accompanied by ultrasonic energy, heat, or both. The addition of one or both of ultrasonic energy and heat may reduce the pressure necessary to form a bond. The contact bumps formed on the mount and/or the contact bumps formed on the LED die undergo plastic deformation (i.e., they do not return to their original shape) during bonding and form continuous or nearly continuous metal supports 46 between the n-contact on the LED die and the mount and 48 between the p-contact on the LED die and the mount. Unlike solder, the contact bumps remain in a solid state during bonding.

During ultrasonic bonding, the LED die is positioned on a mount. A bond head is positioned on the top surface of the LED die, often the top surface of sapphire growth substrate 10 in the case of a III-nitride device grown on sapphire. The bond head is connected to an ultrasonic transducer. The ultrasonic transducer may be, for example, a stack of lead zirconate titanate (PZT) layers. When a voltage is applied to the transducer at a frequency that causes the system to resonate harmonically (often a frequency on the order of tens or hundreds of kHz), the transducer begins to vibrate, which in turn causes the bond head and the LED die to vibrate, often at an amplitude on the order of microns. The vibration causes atoms in the metal lattice of the contact bumps 38 and 40 and structures on the mount to interdiffuse, resulting in a metallurgically continuous joint. Heat and/or pressure may be added during bonding. During ultrasonic bonding, compliant bonding structures such as contact bumps 38 and 40 collapse and reflow.

In some embodiments, the characteristics or arrangement of the contact bumps located at different parts of the device may have different properties. For example, contact bumps may be larger and/or spaced more closely together in areas of the device that need more support during substrate removal. For example, in the areas near where portions of the light emitting and p-type regions are etched to expose the n-type region, the remaining p-type material may be thinned slightly, due to the etch. In these areas, contact bumps may be larger and/or more closely spaced, to provide more support to the thinner semiconductor material.

After bonding LED die 43 to mount 41, the growth substrate on which the semiconductor layers were grown may be removed, for example by laser lift off, etching, or any other technique suitable to a particular growth substrate. After removing the growth substrate, the semiconductor structure may be thinned, for example by photoelectrochemical etching, and/or the surface may be roughened or patterned, for example with a photonic crystal structure. A lens, wavelength converting material, or other structure known in the art may be disposed over LED 43 after substrate removal.

In the devices described above, the n-contact is formed over a series of small openings formed in the p- and light emitting regions, rather than a single, large, recessed opening. As a result, the semiconductor structure on the n-contact side of the device may be sufficiently supported by the contact 38 illustrated in FIG. 3. A separate built-up structure such as the thick n-contact illustrated in FIG. 1 is unnecessary.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is being claimed is:

1. A device comprising:
    a semiconductor structure comprising:
    a light emitting layer disposed between an n-type region and a p-type region;
    an n-contact region and a p-contact region, wherein a cross section of the n-contact region comprises a plurality of first regions wherein portions of the light emitting layer and the p-type region are removed to expose the n-type region, wherein the plurality of first regions are separated by a plurality of second regions wherein second regions comprise a portion of the light emitting layer and a portion of the p-type region; and a trench disposed between the n-contact region and the p-contact region;

a first metal contact formed over the semiconductor structure in the p-contact region; and a second metal contact formed over the semiconductor structure in the n-contact region;

wherein the second metal contact is in electrical contact with at least one of the first regions in the n-contact region wherein the first metal contact and the second metal contact are co-planer.

2. The device of claim 1 wherein the trench electrically isolates the first metal contact from the second metal contact.

3. The device of claim 1 wherein the plurality of first regions comprise holes formed in the semiconductor structure, wherein the holes are between one and five microns wide.

4. The device of claim 3 wherein centers of nearest neighbor holes are spaced between four and eight microns apart.

5. The device of claim 1 wherein the plurality of second regions comprise posts of semiconductor material.

6. The device of claim 5 wherein the posts are between one and five microns wide.

7. The device of claim 1 wherein a cross section of the second metal contact comprises a plurality of hills separated by valleys.

8. The device of claim 1 further comprising an insulating layer disposed on a sidewall of the trench.

9. A method comprising:

etching a semiconductor structure, the semiconductor structure comprising a light emitting layer disposed between an n-type region and a p-type region, to form:

the n-contact region, wherein a cross section of the n-contact region comprises a plurality of first regions wherein portions of the light emitting layer and the p-type region are removed to expose the n-type region, wherein the plurality of first regions are separated by a plurality of second regions wherein second regions comprise a portion of the light emitting layer and a portion of the p-type region; and forming a trench disposed between the n-contact region and the p-contact region;

forming a first metal contact over the p-contact region; and forming a second metal contact over the n-contact region;

wherein the second metal contact is in electrical contact with at least one first regions of the n-contact region wherein the first metal contact and the second metal contact are co-planer.

10. The method of claim 9 further comprising forming a plurality of metal bumps on the first metal contact.

11. The method of claim 10 further comprising bonding the semiconductor structure to a mount, wherein bonding comprises causing the plurality of metal bumps to collapse such that the collapsed bumps electrically and mechanically connect the semiconductor device to the mount and wherein the metal bumps remain in a solid phase during bonding.

12. The method of claim 10 wherein the plurality of metal bumps comprise a metal with a Young's modulus less than 150 GPa.

13. The method of claim 10 wherein:

the plurality of metal bumps each have a width between one and five microns and a height between one and five microns; and nearest neighbor bumps are spaced between four and eight microns apart.

14. The method of claim 9 further comprising:

coating the device with an insulating layer; and removing the insulating layer from the n-contact regions and the p-contact regions such that the insulating layer remains on a sidewall of the trench.

* * * * *